United States Patent
Knittel

(10) Patent No.: US 8,437,060 B2
(45) Date of Patent: May 7, 2013

(54) APPARATUS AND METHOD FOR READING AND APPARATUS FOR READING AND WRITING HOLOGRAMS

(75) Inventor: Joachim Knittel, Tuttlingen (DE)

(73) Assignee: Thomson Licensing, Boulogne, Billancourt (FR)

(*) Notice: Subject to any disclaimer, the term of this patent is extended or adjusted under 35 U.S.C. 154(b) by 748 days.

(21) Appl. No.: 12/653,241

(22) Filed: Dec. 10, 2009

(65) Prior Publication Data

US 2010/0157401 A1    Jun. 24, 2010

(30) Foreign Application Priority Data

Dec. 23, 2008  (EP) .................................... 08306008

(51) Int. Cl.
*G03H 1/02* (2006.01)
(52) U.S. Cl.
USPC ............................................................. 359/27
(58) Field of Classification Search .................. None
See application file for complete search history.

(56) References Cited

U.S. PATENT DOCUMENTS

| 5,299,035 | A |  | 3/1994 | Leith et al. |
| 5,317,147 | A |  | 5/1994 | Dandliker |
| 5,883,875 | A |  | 3/1999 | Coufal et al. |
| 6,128,109 | A | * | 10/2000 | Jenkins et al. ................. 359/11 |
| 2003/0104285 | A1 |  | 6/2003 | Hirao et al. |
| 2009/0028035 | A1 |  | 1/2009 | Sano et al. |

FOREIGN PATENT DOCUMENTS

| CH |  | 681117 A5 | 1/1993 |
| EP |  | 0554211 | 8/1993 |
| WO | WO 2006/118082 |  | 11/2006 |

OTHER PUBLICATIONS

English Machine Translation of WIPO Publication WO/2006/118082 (Application PCT/JP2006/308573). Published Nov. 9, 2006. Sano et al.*
English Machine Translation of Swiss Publication CH 681117 A5. Published Jan. 15, 1993. Oehler.*
Search Report dated Feb. 19, 2009.

* cited by examiner

*Primary Examiner* — Derek S Chapel
(74) *Attorney, Agent, or Firm* — Jeffrey D. Carter

(57) ABSTRACT

An apparatus for reading and writing holograms from and to a holographic storage medium uses an object beam and a reference beam both having a first coherence length and being guided along separate optical branches of an optical setup to be imaged to the holographic storage medium. The apparatus includes one or more elements for reducing the coherence length of the reference beam to a second coherence length for reading out a hologram from the holographic storage medium, wherein the second coherence length is shorter than the first coherence length.

12 Claims, 2 Drawing Sheets

APPARATUS AND METHOD FOR READING AND APPARATUS FOR READING AND WRITING HOLOGRAMS

This application claims the benefit, under 35 U.S.C. §119, of European Patent Application No. 08306008.7 of 23 Dec. 2009.

FIELD OF THE INVENTION

The present invention relates to an apparatus and a method for reading data holograms from a holographic storage medium and to an apparatus for reading data holograms from and writing data holograms to a holographic storage medium.

BACKGROUND OF THE INVENTION

In holographic data storage, digital data is stored by recording the interference pattern produced by the superposition of two coherent laser beams. Where one beam, the so-called "object beam", is modulated by a spatial light modulator (SLM) and carries the information/data to be recorded, the second beam serves as a reference beam. The interference pattern leads to a modification of specific properties of the storage material, which depend on the local intensity of the interference pattern. Reading of a recorded hologram is performed by illuminating the hologram with the reference beam using the same conditions as during recording. This results in the reconstruction of the recorded object beam, the so called reconstructed object beam that is detected by a detector array.

One advantage of holographic data storage is an increased data capacity per volume and a higher data transfer rate. Instead of storing single bits, as it is known from conventional media such as CD or DVD, data is stored as data pages. Typically, a data page consists of a matrix of light-dark-patterns, i.e. a two dimensional binary array or an array of grey values, which code multiple bits. This allows to achieve an increased data rate in addition to the increased data storage density.

Conventional optical storage media only use a single or a few 2-dimensional layers for data storage. Contrary, in holographic data storage media the volume of the medium is used for storing data instead of a layer. Further, the volume of the material used for data storage is not completely exhausted when data is written to it. The advantage of holographic data storage is the possibility to store multiple data in the same volume. This is achieved e.g. by changing the angle between the object beam and the reference beam, called angle multiplexing. A further option, called shift multiplexing, applies a slight shift between subsequent holograms, which do overlap each other for the most part. Shift multiplexing is performed e.g. by movement of the storage material.

However, the reconstructed object beam suffers under interference effects with stray light inside the optical setup of the apparatus for holographic data stage. The result of such interference effects is a disturbed reconstructed object beam that in turn leads to data readout errors.

SUMMARY OF THE INVENTION

Accordingly, it is an object of the present invention to provide an apparatus and a method for reading holograms from a holographic storage medium and an apparatus for reading and writing holograms from and to a holographic storage medium that are improved with respect to data readout error rates.

The problem is solved by the subject matter of the independent claims. Advantageous embodiments of the invention are subject matter of the dependent claims.

With the object in view an apparatus for reading and writing holograms from and to a holographic storage material is provided that uses an object beam and a reference beam both having a first coherence length, and that are guided along separate optical branches of an optical setup to be imaged to the holographic storage medium. Said apparatus comprises means for reducing the coherence length of the reference beam to a second coherence length for reading out a hologram from the holographic storage medium, wherein the second coherence length is shorter than the first coherence length.

The concept of the aforementioned apparatus is based on the following considerations:

A hologram is generated by constructive and destructive interference of an object beam and a reference beam. Interference effects can only be observed for coherent laser beams, i.e. the coherence length of interfering beams should be larger or equal than the optical path difference between the two interfering beams. The coherence length used in the writing process is called a first coherence length. During the read-out process, a laser beam with a second coherence length is used.

It has been figured out that part of the disturbances in the reconstructed object beam are due to coherent stray light inside the optical setup that interferes with the reconstructed object beam.

This problem is faced by reducing the coherence length of the reference beam used for read-out of the hologram. The coherence length is set to a second coherence length that is shorter than the first coherence length used for writing the hologram. Consequently, interference effects between stray light caused by reflections of the reference beam inside the optical setup and the reconstructed object beam are significantly reduced.

The apparatus for reading and writing holograms is advantageous because data read-out errors are significantly reduced. In general, interference between two coherent beams of equal intensity results in a beam showing a four times higher peak intensity than the original beams, in case of complete constructive interference. In case the coherence length of two laser beams is too low to cause interference effects, the superposition of the two laser beams leads to the mere sum of the intensities. In case of an apparatus for reading out holograms, the stray light and the reconstructed object beam that are superpositioned result in the mere sum of the respective intensities in contrast to a possible quadratic intensity super elevation in case of coherent interference.

Speaking of holograms in the form of data pages, interference results in pixel errors, i.e. data bit errors, due to the fact that it is possible that the intensity of a single or a couple of pixels of a data page is changed due to constructive or destructive interference with coherent stray light. In case of a mere superposition of non-coherent stray light with the reconstructed object beam, the effect is significantly weaker.

According to a first embodiment, the second coherence length is lower or equal than a distance between the hologram inside the holographic storage medium and the nearest optical surface outside said holographic storage medium, wherein the distance is determined in the direction of propagation of the object and the reference beam. The first step when considering the emission of stray light is the determination of the optical surfaces reflecting the respective stray light. In case the coherence length of the reference beam during the read-out process is shorter than the distance from the hologram to the next optical surface, it is impossible for the reconstructed optic beam and said stray light to show constructive or destructive interference effects. The only interaction that is possible is a mere addition of light intensities that, as discussed before, results in an increased background level.

However, according to a further embodiment, the second coherence length, i.e. the coherence length used during the read-out process, is larger than or equal to a thickness of the holographic storage material, wherein the thickness is determined in a direction of propagation of the object beam and the reference beam. According to the aforementioned embodiment the reliability of the read-out process is significantly improved, because coherent interference is strictly necessary for the reconstruction of the object beam.

The above mentioned considerations and advantages apply to an apparatus and a method for reading holograms from a holographic storage medium accordingly.

Said apparatus comprises a laser diode for generating a reference beam having a coherence length that is shorter than or equal to a distance between the hologram inside the holographic storage medium and the nearest optical surface outside said holographic storage medium, wherein the distance is determined in the direction of propagation of the object and the reference beam.

Said method for reading a hologram from a holographic storage medium applies a reference beam generated by a laser diode, wherein the reference beam has a coherence length that is shorter than or equal to a distance between the data hologram inside the holographic storage medium and a nearest optical surface outside the holographic storage medium. The distance is determined in a direction of propagation of the reference beam.

The first step when considering the emission of stray light is the determination of the optical surfaces that cause reflections of the reference beam leading to coherent stray light. In case the coherence length of the reference beam during the read-out process is shorter than the distance from the hologram to the next optical surface, it is impossible for the reconstructed optic beam and said stray light to show interference effects. The only interaction that is possible is a mere addition of light intensities that as discussed before results in an much weaker effect.

DETAILED DESCRIPTION OF PREFERRED EMBODIMENTS

Figure 1:
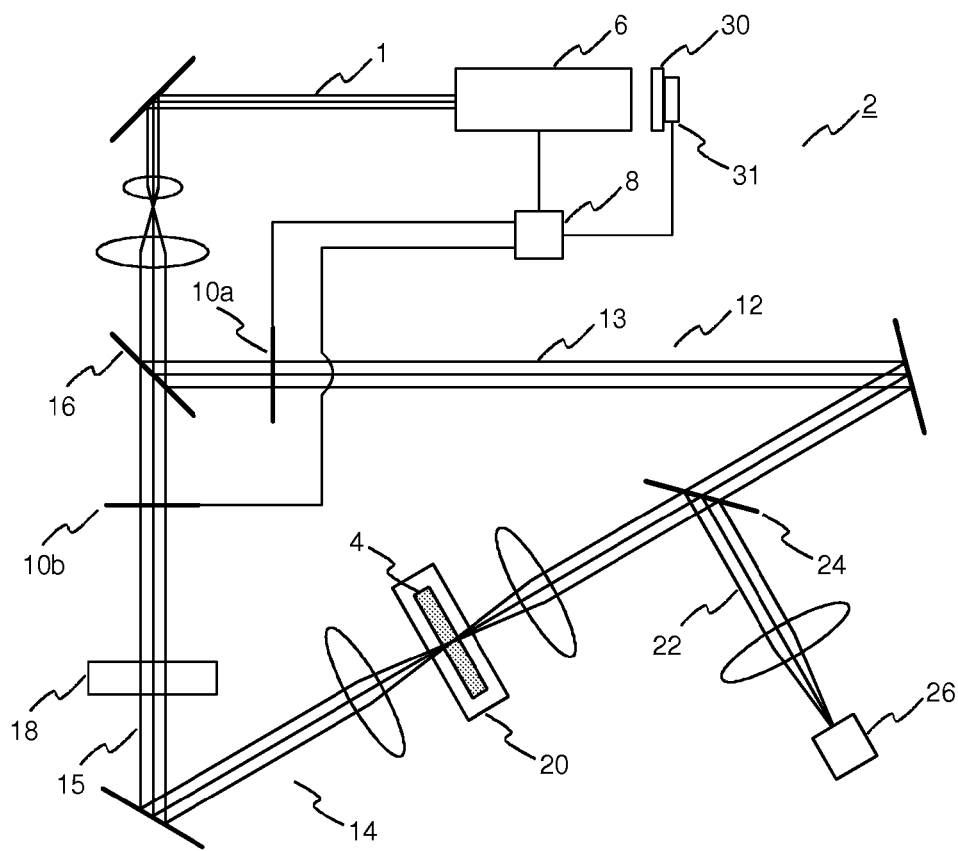
FIG. 1 shows an apparatus for reading data from and for writing data to a holographic storage medium.

In the following, the invention shall be explained in more detail with reference to the figures. Similar or corresponding details in the figures are marked with the same reference numerals. It is understood that the invention is not limited to the exemplary embodiments, specific features can expediently by combined and/or modified without departing from the invention.

In holographic data storage, digital data is stored by recording the interference pattern generated by two coherent laser beams, the object beam and the reference beam. FIG. 1 shows an exemplary setup of an apparatus 2 for writing and reading holograms to and from a holographic storage medium 20.

The apparatus 2 comprises a light source, preferably a laser diode 6 with an external cavity, emitting a laser beam 1 that is split up by a beam splitter 16 into a reference beam 13 and an object beam 15. The two beams 13, 15 are guided along separate optical branches. A first branch 12 is used to guide the reference beam 13 to the holographic storage medium 20, while the second branch 14 is used for the object beam 15. The coherence length of the laser diode 6 is controlled by a control unit 8 that further controls two shutters 10a, 10b located in the first branch and the second branch 12, 14, respectively.

During the writing process the control unit 8 sets the laser diode 6 to a first coherence length and both shutters 10a, 10b are opened, while during the reading process the laser diode 6 is set to a second, shorter coherence length and shutter 10b located in the second branch 14 that is used for the object beam 15 is set to a closed state.

The laser diode 6 comprises an external cavity with a mirror 30 that is mounted on a piezo-actuator 31. Said piezo-actuator is fed with a high frequency modulated drive current during the read-out process of a hologram. For this purpose the control unit 8 acts as an actuator controller for the piezo-actuator, i.e. a means for reducing the coherence length of the laser diode 6. Due to the fact that the mirror of the cavity is vibrated by the piezo-actuator, the coherence length of the laser diode 6 is reduced. The aforementioned state of operation of the laser diode 6 is called the "low coherence state". A further option to operate the laser diode 6 in the low coherence state is feeding the laser diode 6 with a drive current that is high frequency modulated. For this purpose the control unit 8 acts as a drive current modulator for the laser diode 6. In case none of the aforementioned operating states is selected, i.e. the laser diode 6 is operated in "normal" state emitting a laser beam with a standard coherence length. This mode of operation is called the "high coherence state".

During the writing process both shutters 10a, 10b are open and the laser diode 6 is operated in the high coherence state. The laser beam 1 that is emitted by the laser diode 6 is split up into the reference beam 13 traveling along the first branch 12 and the object beam 15 traveling along the second branch 14 by help of a beam splitter 16. The object beam 15 is modulated by a transmissive spatial light modulator 18. Preferably, a liquid crystal array is used as a spatial light modulator 18. However, without departing from the concept of the invention, a reflective spatial light modulator in combination with an adapted optical setup can be applied.

The object beam 15 and the reference beam 13 interfere inside the holographic storage medium 20. More precisely, the aforementioned beams interfere inside a holographic storage material 4 that is located in the center of a sandwich-like holographic storage medium 20. The configuration of the holographic storage medium 20 will be explained in more detail in connection with FIG. 2.

Preferably, the coherence length of the laser 6 during the writing process is set to a value that is at least the length difference between the first and second branch 12, 14. This assures that the interference between the reference beam 13 and the object beam 15 at the position of the holographic storage material 4 results in a hologram offering a satisfactory grating strength and contrast.

During the read-out process, the shutter 10b that is located in the second branch 14 is set to a closed state by the control unit 8. Further, the control unit 8 decreases the coherence length of the laser diode 6 by setting it to one of the aforementioned low coherence operating modes. The low coherent laser beam 1 travels along the first branch 12 to reach the holographic storage medium 20. Due to interference of the reference beam 13 with the hologram stored inside the holographic storage material 4, a reconstructed object beam 22 is generated, which is focused by help of a second beam splitter 24 to an array detector 26.

It is understood the apparatus 2 shown in FIG. 1 is also able to act as an apparatus 2 for reading only data holograms from the holographic storage medium 20. In that case the second branch 14 used for the guidance of the object beam 15 is completely omitted.

Figure 2:
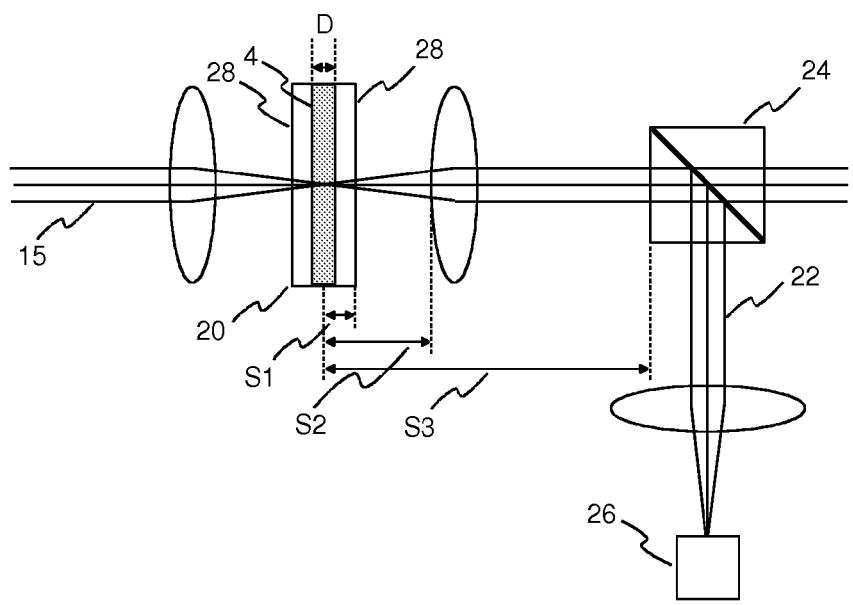
FIG. 2 shows a detailed view of the optical setup in FIG. 1.

FIG. 2 shows a detailed view of the apparatus 2 known from FIG. 1. The holographic storage medium 20 exhibits a sandwich-like structure of two substrates 28 of about 500 μm thickness side by side the holographic storage material 4, which has a thickness D of preferably between 100 μm and 500 μm.

In order to avoid interference effects between the reconstructed object beam 22 and coherent stray light reflected by one of the optical surfaces of the holographic setup, the coherence length of the reference beam 13 used for read-out of the hologram is reduced. Preferably, the coherence length of the reference beam 13 is shorter than the distance between the hologram and the next optical surface in a direction of propagation of the reference or object beam 13, 15. In case, for example, coherent stray light from the surface of the second beam splitter 24 is found to cause interference effects with the reconstructed object beam 22, the coherence length of the reference beam 13 should be shorter than distance S3. The same applies for the distances S1 and S2 corresponding to the distance between the hologram and the surface of the holographic storage medium 20 and the objective lens 30, respectively.

Figure 3:
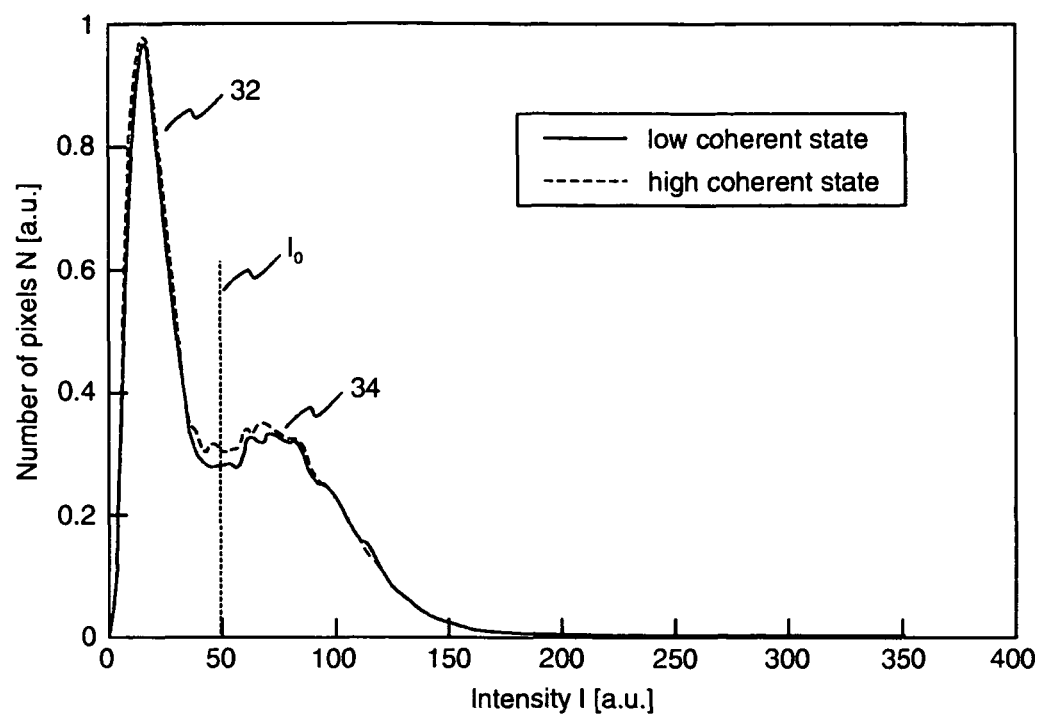
FIG. 3 shows schematic histograms of "on" and "off" pixels, in case of readout with a high and a low coherence reference beam.

The named advantages of the apparatus for reading and writing holograms from and to the holographic storage medium 20 also apply to an apparatus that reads only data holograms from the holographic storage medium 20, as will be explained in more detail with reference to FIG. 3. The number N of pixels shown in arbitrary units on the ordinate of FIG. 3 is assigned to intensity I also in arbitrary units on the abscissa. In other words FIG. 3 shows the number N of pixels showing a certain intensity I. The left and higher peak 32 indicates the number of dark pixels in a data page, while the right and lower peak 34 corresponds to bright pixels in said data page. For data read-out of the data page a threshold value is set to a certain value $I_0$ and all pixels below the threshold value $I_0$ are assumed to be dark, while all pixels above the threshold value $I_0$ are assumed to be bright. According to the present embodiment, the threshold is set to an intensity level $I_0=50$. The threshold value $I_0$ is preferably set to the minimum in the intensity between the higher peak 32, indicating dark pixels and the lower peak 34, indicating bright pixels.

A dashed line in FIG. 3 represents the case that the read-out process, in contrary to the aforementioned embodiments, is performed with reference beam 13 that has a high coherence length. The solid line represents the case that the read-out process is performed with reference beam 13 that has a low coherent length. The probability of data readout errors is determined by looking at the number of pixels in the vicinity of the threshold value $I_0$. FIG. 3 clearly indicates that in case of a read-out process with a reference beam that shows a high coherence length a larger number of pixels are found around the threshold value $I_0$ compared to the case the holograms are read-out using a reference beam 13 with a low coherence length. The amount of pixels in the respective area around the threshold value $I_0$ can clearly be lowered by using a low coherent reference beam 13 for read-out of the data hologram. Therefore, less uncertain data pixels with an intensity that cannot clearly be assigned to be bright or dark is reduced. Consequently, the data read-out error rate is significantly improved.

Reference Signs
1 Light Beam
2 Apparatus
4 Holographic Storage Material
6 Laser
8 Control Unit
10a,10b Shutter
12 First Branch
13 Reference Beam
14 Second Branch
15 Object Beam
16 Beam Splitter
18 Spatial Light Modulator
20 Holographic Storage Medium
22 Reconstructed Object Beam
24 Second Beam Splitter
26 Array Detector
28 Substrate
30 Object Lens
32,34 Peak
D Thickness Of The Holographic Storage Material
S1 . . . S3 Distance
N Number Of Pixels
I Intensity
$I_0$ Threshold

What is claimed, is:

1. An apparatus for reading and writing holograms from and to a holographic storage medium using an object beam and a reference beam both having a first coherence length and being guided along separate optical branches of an optical setup to be imaged to the holographic storage medium, the apparatus comprising means for reducing the coherence length of the reference beam to a second coherence length for reading out a hologram from the holographic storage medium, wherein the second coherence length is shorter than the first coherence length of the reference beam, wherein the second coherence length is shorter than or equal to a distance between the hologram inside the holographic storage medium and a nearest optical surface outside the holographic storage medium, wherein the distance is determined in a direction of propagation of the object and the reference beam.

2. The apparatus according to claim 1, wherein the second coherence length is larger than or equal to a thickness of the holographic storage material, determined in a direction of propagation of the object and the reference beam.

3. The apparatus according to claim 1, wherein the optical setup comprises a laser diode emitting a laser beam that is split up into the object beam and the reference beam, and wherein the laser diode is fed with a high frequency modulated drive current during read-out of the hologram in order to reduce a coherence length of the laser beam to the value of the second coherence length.

4. The apparatus according to claim 1, wherein the optical setup comprises a laser diode with an external cavity having a mirror that is mounted on a piezo actuator, said laser diode emitting a laser beam that is split up into the object beam and the reference beam, and wherein the piezo actuator is fed with a high frequency modulated drive current during read-out of the hologram in order to reduce a coherence length of the laser beam to the value of the second coherence length.

5. An apparatus for reading a hologram from a holographic storage medium, comprising a laser diode for generating a reference beam having a coherence length, wherein the coherence length is shorter than or equal to a distance between a data hologram inside the holographic storage medium and a nearest optical surface outside the holographic storage medium, wherein the distance is determined in a direction of propagation of the reference beam.

6. The apparatus according to claim 5, wherein the coherence length is larger than or equal to a thickness of the holographic storage material, determined in a direction of propagation of the reference beam.

7. The apparatus according to claim 5, comprising a drive current modulator for feeding the laser diode with a high frequency modulated drive current during read-out of the hologram in order to reduce the coherence length of the reference beam.

8. The apparatus according to claim 5, wherein the laser diode has an external cavity with a mirror that is mounted on a piezo actuator, and an actuator controller for feeding the piezo actuator with a high frequency modulated drive current during read-out of the hologram in order to reduce the coherence length of the reference beam.

9. A method for reading a hologram from a holographic storage medium with a reference beam generated by a laser diode, wherein the reference beam has a coherence length that is shorter than or equal to a distance between a data hologram inside the holographic storage medium and a nearest optical surface outside the holographic storage medium, wherein the distance is determined in a direction of propagation of the reference beam.

10. The method according to claim 9, wherein the coherence length is larger than or equal to a thickness of the holographic storage material, determined in a direction of propagation of the reference beam.

11. The method according to claim 9, further comprising the step of feeding the laser diode with a high frequency modulated drive current during read-out of the hologram in order to reduce the coherence length of the reference beam.

12. The method according to claim 9, further comprising the step of feeding a piezo actuator, on which a mirror of an external cavity of the laser diode is mounted, with a high frequency modulated drive current during read-out of the hologram in order to reduce the coherence length of the reference beam.

* * * * *